United States Patent
Xin et al.

(10) Patent No.: US 10,612,691 B2
(45) Date of Patent: Apr. 7, 2020

(54) MICRO ELECTRICAL MECHANICAL SYSTEM (MEMS) VALVE

(71) Applicant: International Business Machines Corporation, Armonk, NY (US)

(72) Inventors: Yongchun Xin, Poughkeepsie, NY (US); Jonathan Fry, Fishkill, NY (US); Daniel Piper, Vancouver, WA (US); Jang Sim, Dutchess, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/869,562

(22) Filed: Jan. 12, 2018

(65) Prior Publication Data
US 2019/0219193 A1 Jul. 18, 2019

(51) Int. Cl.
*F16K 99/00* (2006.01)
*B81B 7/02* (2006.01)
(Continued)

(52) U.S. Cl.
CPC .... *F16K 99/0005* (2013.01); *B01L 3/502738* (2013.01); *B01L 3/502769* (2013.01);
(Continued)

(58) Field of Classification Search
USPC .................................. 251/59, 208, 324, 352
See application file for complete search history.

(56) References Cited

U.S. PATENT DOCUMENTS

| 6,137,206 A | 10/2000 | Hill |
| 6,386,507 B2 | 5/2002 | Dhuler |

(Continued)

FOREIGN PATENT DOCUMENTS

CN 104609357 A 5/2015

OTHER PUBLICATIONS

"10-Way Micro Switching Valve Chip for Multl-Directional Flow Control" Tadahiro Hasegawa, Koji Ikuta, and Kenichiro Nakashima 7th International Conference on Miniaturized Chemical and Biochemical Analysts Systems Oct. 5-9, 2003, pp. 215-218.
(Continued)

*Primary Examiner* — Jessica Cahill
*Assistant Examiner* — Daphne M Barry
(74) *Attorney, Agent, or Firm* — Cantor Colburn LLP; Alvin Borromeo

(57) ABSTRACT

A micro electrical mechanical system (MEMS) valve is provided. The MEMS valve includes first and second bodies, a medium and a thermal element. The first body defines a first channel and a second channel intersecting the first channel. The second body defines a third channel and is movable within the first channel between first and second positions. When the second body is at the first positions, the second and third channels align and permit flow through the second and third channels. When the second body is at the second positions, the second and third channels misalign and inhibit flow through the second channel. The medium is charged into the first channel at opposite sides of the second body. The thermal element is proximate to the first channel and is operable to cause the medium to drive movements of the second body to the first or the second positions.

13 Claims, 7 Drawing Sheets

(51) Int. Cl.
  *B01L 3/00* (2006.01)
  *B81C 1/00* (2006.01)
(52) U.S. Cl.
  CPC .......... *B81B 7/02* (2013.01); *B81C 1/00119* (2013.01); *F16K 99/0011* (2013.01); *F16K 99/0013* (2013.01); *F16K 99/0026* (2013.01); *B01L 2200/027* (2013.01); *B01L 2300/1827* (2013.01); *B01L 2400/065* (2013.01); *B01L 2400/0644* (2013.01); *B81B 2201/03* (2013.01); *B81B 2201/054* (2013.01); *F16K 2099/0074* (2013.01)

(56) References Cited

U.S. PATENT DOCUMENTS

| | | | |
|---|---|---|---|
| 6,612,535 B1 | 9/2003 | Tai | |
| 6,615,855 B2 | 9/2003 | Lopez et al. | |
| 7,367,359 B2 | 5/2008 | Maluf et al. | |
| 7,719,161 B2 | 5/2010 | Heo | |
| 7,740,454 B2 | 6/2010 | Kim et al. | |
| 7,981,386 B2 | 7/2011 | McAvoy et al. | |
| 8,851,117 B2 | 10/2014 | Xie | |
| 2010/0239436 A1 | 9/2010 | Bonne et al. | |
| 2011/0073788 A1 | 3/2011 | Marcus et al. | |
| 2014/0144248 A1* | 5/2014 | Walters | F16K 3/0209 73/861.61 |
| 2016/0033055 A1* | 2/2016 | Zhang | F16K 99/0011 137/625.48 |
| 2017/0001195 A1 | 1/2017 | Unger | |

OTHER PUBLICATIONS

"Membrane-activated microfluidic rotary devices for pumping and mixing" Seng, Hao Yu; Wang, Chih Hao; Lin, Wang Ying; Lee, Gwo Bin Biomedical Microdevices 9.4: 545-554. Springer. (Aug. 2007).
List of IBM Patents or Patent Applications Treated as Related; (Appendix P), Filed Jan. 12, 2018; 2 pages.

* cited by examiner

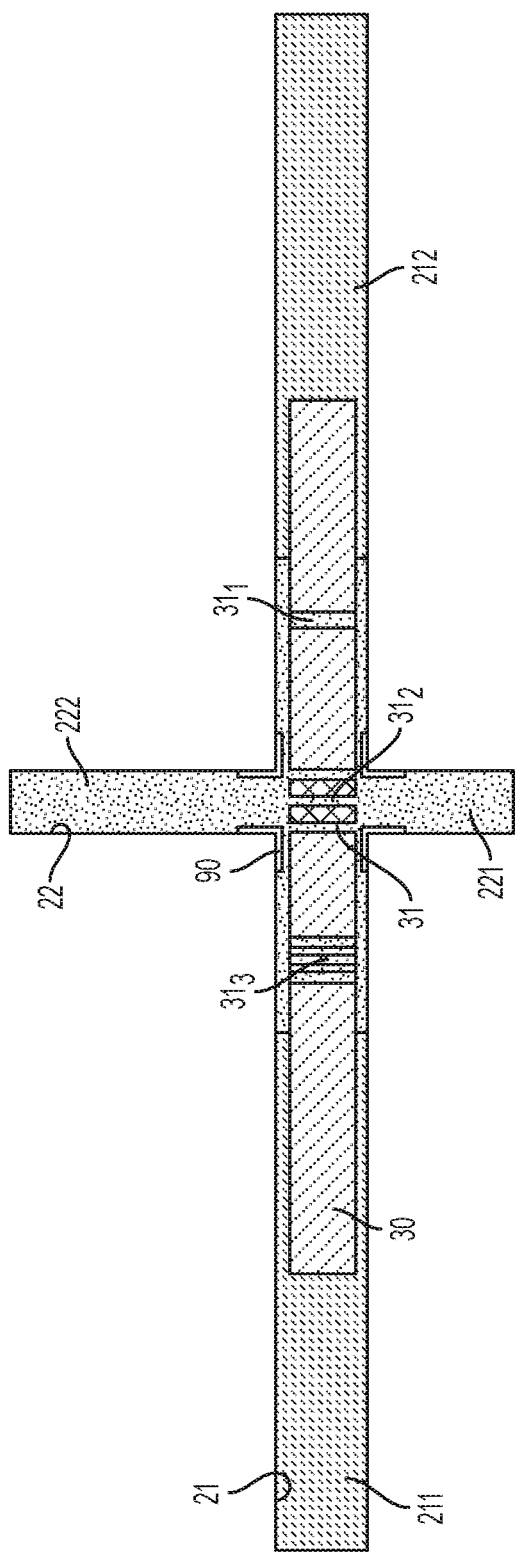
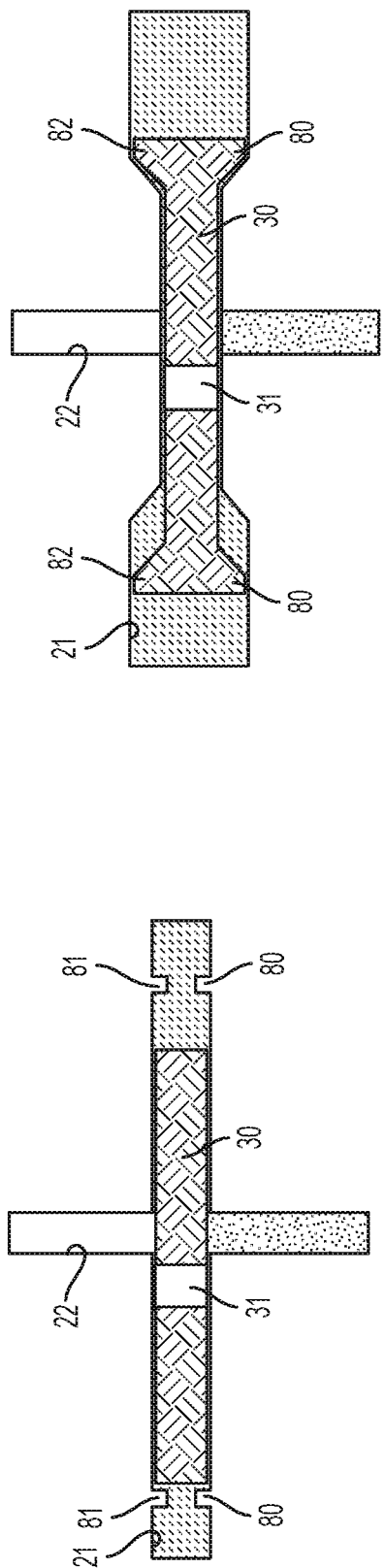
FIG. 4
FIG. 5
FIG. 6

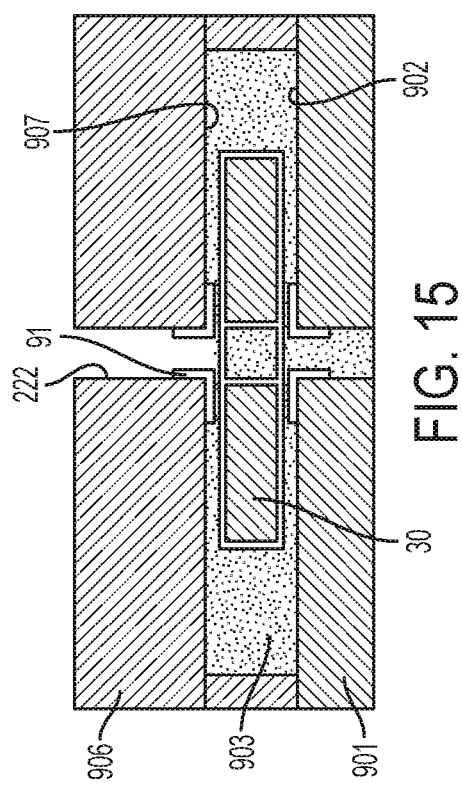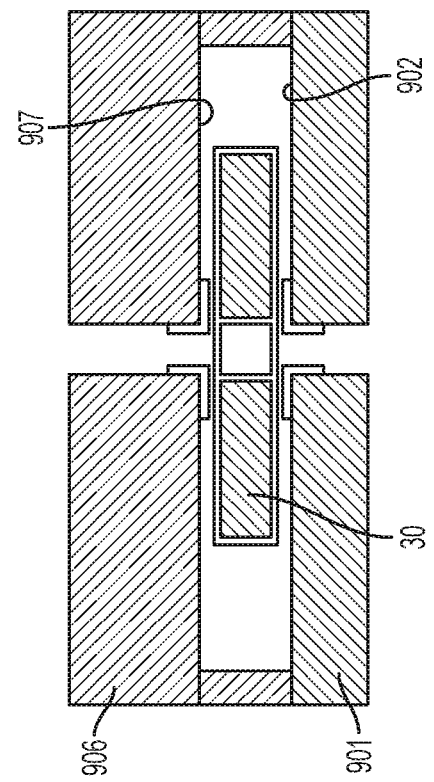

MICRO ELECTRICAL MECHANICAL SYSTEM (MEMS) VALVE

BACKGROUND

The present invention generally relates to valves and more specifically to micro electrical mechanical system (MEMS) valves.

Micro electrical mechanical systems (MEMS) is the technology of microscopic devices and is particularly concerned with devices having moving parts. In some cases, MEMS devices are used in the dispensation of chemicals especially where the dispensation is at the micro scale and the amounts of the chemicals need to be dispensed in exact amounts. In such cases, the MEMS devices need to be able to control a volume of each dispensed chemical and it is often required that this volumetric control system be robust and able to withstand motion and movement.

SUMMARY

According to one or more embodiments, a micro electrical mechanical system (MEMS) valve is provided. The MEMS valve includes first and second bodies, a medium and a thermal element. The first body defines a first channel and a second channel intersecting the first channel. The second body defines a third channel and is movably disposed within the first channel to move between first positions with the second and third channels aligned to permit flow through the second and third channels and second positions with the second and third channels misaligned to inhibit flow through the second channel. The medium is charged into the first channel at opposite sides of the second body. The thermal element is proximate to the first channel and operable to adjust relative temperatures and pressures of the medium at the opposite sides of the second body to drive movements thereof to the first or the second positions.

According to one or more embodiments, an exact microfluidics dispensation system is provided. The exact microfluidics dispensation system includes a micro electrical mechanical system (MEMS) valve. The MEMS valve includes a first body, a second body movably disposed within the first body to permit or prevent fluid flow through the first body and an actuator configured to operate the MEMS valve without deforming the MEMS valve. The exact microfluidics dispensation system further includes a sensor and a controller. The sensor is disposed to sense fluid flow through the first body and to generate readings accordingly. The controller is coupled to the actuator and the sensor and is configured to control the actuator based on the readings of the sensed fluid flow generated by the sensor.

According to one or more embodiments, a method of fabricating a micro electrical mechanical system (MEMS) valve is provided. The method includes forming a first body to define a first channel and a second channel intersecting the first channel and to include a thermal element proximate to the first channel. The method further includes capping a second body defining a third channel with self-release etchant resistant material and disposing self-release material and the capped second body in the first channel such that the self-release material surrounds the capped second body and such that the third channel is parallel with and movably disposed for alignment or misalignment relative to the second channel. In addition, the method includes etching the self-release material from around the capped second body.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4 is a schematic side view of a portion of the MEMS valve of FIG. 1 and additional features thereof in accordance with embodiments;

FIG. 5 is a schematic side view of a portion of the MEMS valve of FIG. 1 and stoppers in accordance with embodiments;

FIG. 6 is a schematic side view of a portion of the MEMS valve of FIG. 1 and stoppers in accordance with embodiments;

FIG. 15 is a schematic illustration of a first late stage of a fabrication of a MEMS valve in accordance with embodiments; and FIG. 16 is a schematic illustration of a second late stage of a fabrication of a MEMS valve in accordance with embodiments.

Figure 1:
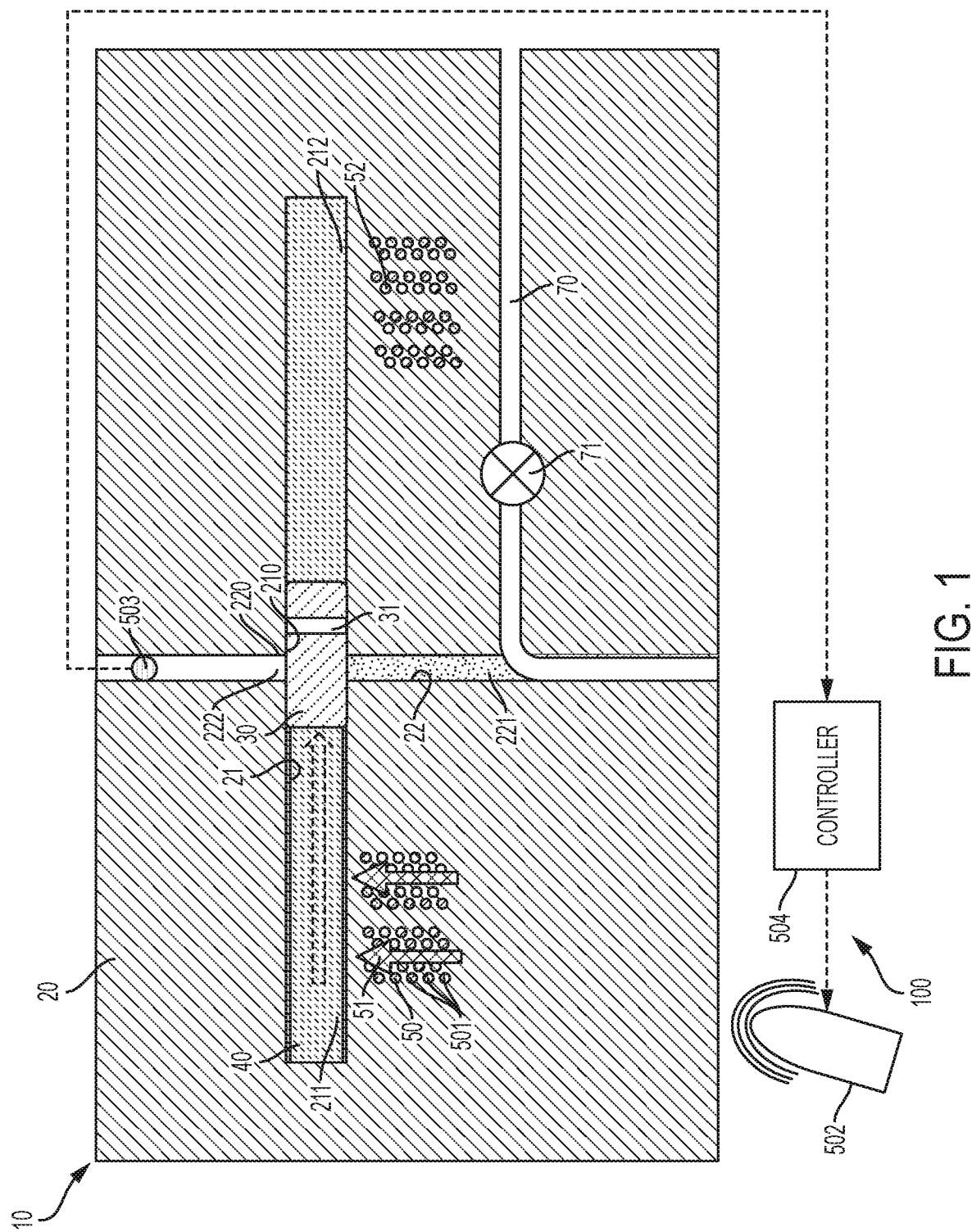
FIG. 1 is a schematic side view of a micro electrical mechanical system (MEMS) valve and an exact microfluidics dispensation system in which the MEMS valve is used in accordance with embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

Turning now to an overview of technologies that are more specifically relevant to aspects of the invention, currently available MEMS devices are typically incapable of dispensing exact amounts of chemicals for chemical processes at micro scales while also being formed to be robust and capable of withstanding motion or movement. For example, MEMS pumps suffer from manufacturing variation and are often uncontrollable to the extent required (i.e., MEMS pumps lack adjustable voltage rails or clocks as in transistor systems. In addition, MEMS pumps are typically not adjustable and are incapable of compensation. Also, performance characteristics of MEMS pumps can change over time as moving parts degrade, exhibit build-ups of biofilms or reactive agents, etc. With respect to MEMS valves, many MEMS valve designs are based on device elastic deformation that experience fatigue failure over time.

Turning now to an overview of the aspects of the invention, one or more embodiments of the invention address the above-described shortcomings of the prior art by providing for a general-purpose reusable MEMS system device, such as an implantable multi-drug dispenser for example, with components that can run without fatigue or loss over long periods of time with high tension working conditions.

The above-described aspects of the invention address the shortcomings of the prior art by providing for a microfluidics valve or a micro electrical mechanical system (MEMS) valve that can be easily, accurately and controllably operated without elastic deformation over a long working lifetime. The MEMS valve can be used in MEMS pump feedback control systems and/or exact dispensing systems. In general, the MEMS valve includes first and second bodies, a medium and a thermal element. The first body defines a first channel and a second channel intersecting the first channel. The second body defines a third channel and is movable within the first channel between first and second positions. When the second body is at the first positions, the second and third channels align and permit flow through the second and third channels. When the second body is at the second positions, the second and third channels misalign and inhibit flow through the second channel. The medium is charged into the first channel at opposite sides of the second body. The thermal element is proximate to the first channel and is operable to cause the medium to drive movements of the second body to the first or the second positions.

Turning now to a more detailed description of aspects of the present invention, FIG. 1 depicts a micro electrical mechanical system (MEMS) valve 10. As shown in FIG. 1, the MEMS valve 10 includes a first body 20, a second body 30, a medium 40 and a thermal element 50.

The first body 20 can be formed of photoresist material, such as an epoxy-based negative photoresist, or, more particularly, from polymethymethacrylate (PMMA), polycarbonate (PC) or polyimide (PI) and has a bulk, volumetric shape that is formed to define a first channel 21 and a second channel 22. A surface coating of polydimethylsiloxane (PDMS) or another similar material can be applied to external surfaces of the first body 20. The second channel 22 is disposed, configured and oriented to intersect with the first channel 21. The respective intersecting portions of the first channel 21 and the second channel 22 are first channel portion 210 and second channel portion 220, respectively. The second channel 22 further includes inlet portion 221 defined at a first side of the first channel 21 and an outlet portion 222 defined at a second side of the first channel 21.

The second body 30 can be referred to as a "slide valve" in some embodiments and as a "rotary valve" in other embodiments. It is to be understood that the "slide valve" embodiments will be discussed with reference to FIGS. 1-6 and 9-16, that the "rotary valve" embodiments will be discussed with reference to FIGS. 7A, 7B and 7C and that FIG. 8 is relevant to both embodiments. This is done for clarity and brevity and it is to be further understood that the system features in FIG. 1 are generic to both embodiments and that the method illustrated in FIGS. 9-16 are generic to both embodiments.

The second body 30 can be formed of various materials including, but not limited to, photoresist materials similar to those of the first body 20 and, in accordance with some embodiments, the second body 30 can be formed of low mass dielectric material, such as Xerogel™. The second body 30 is movably disposable in the first channel 21 and is formed to define at least one third channel 31. The at least one third channel 31 is disposed, configured and oriented to be parallel with and to be able to be aligned with the second channel 22. The second body 30 is sized to tightly fit (i.e., with limited clearance) in the first channel 21 while remaining movable between first axial positions and second axial positions within the first channel 21.

In some embodiments, as noted above, the movements of the second body 30 are sliding movements. The first axial positions are those axial positions at which the second body 30 is axially positioned within the first channel 21 whereby the second channel 22 and the at least one third channel 31 are axially aligned with each other and thus permit flow through the second channel 22 and the at least one third channel 31. Conversely, the second axial positions are those axial positions at which the second body 30 is axially positioned within the first channel 21 whereby the second channel 22 and the at least one third channel 31 are axially misaligned with each other and thus inhibit flow through the second channel 22. That is, when the second body 30 is axially positioned at one or more of the first axial positions, the at least one third channel 31 becomes axially aligned with the second channel 22 and fluid flow is thus permitted through the inlet portion 221, then through the at least one third channel 31 and then through the outlet portion 222. On the other hand, when the second body 30 is axially positioned at one or more of the second positions, the at least one third channel 31 becomes axially misaligned with the second channel 22 and fluid flow is thus blocked by the second body 30 such that the fluid flow is inhibited from flowing through the inlet portion 221 and to either the third channel 31 or the outlet portion 222.

With the second body 30 movably disposed within the first channel 21, the second body effectively divides the first channel 21 into a first channel side 211 on one side of the second body 30 and a second channel side 212 on an opposite side of the second body 30. The medium 40 can be any gaseous fluid that increases in volume due to heating and decreases in volume due to cooling. The medium 40 can include, but is not limited to, air and is charged into the first channel side 211 and into the second channel side 212. As such, as the medium 40 charged into the first channel side 211 is heated and increases in volume, the second body 30 is driven or urged toward the second channel side 212. More particularly, in an event the components described herein are configured such that the second body 30 is axially positioned at one or more of the first axial positions with the third channel 31 axially aligned with the second channel 22 when the medium 40 charged into the first channel side 211 is unheated, the second body 30 will slide toward one or more of the second axial positions whereby the second channel 22 and the third channel 31 are axially misaligned when the medium 40 charged into the first channel side 211 is heated.

The thermal element 50 can be suspended or otherwise supported within the first body 20 at one or more positions which are proximate to the first channel 21. That is, the thermal element 50 may include a first thermal element part 51, which is disposed proximate to the first channel side 211, a second thermal element part 52, which is disposed proximate to the second channel side 212. In any case, the thermal element 50 includes excitable components 501 that are configured to be excitable by an external stimulus such that they heat up and thereby cause the medium 40 to correspondingly heat up. That is, the thermal element 50 is operable to adjust relative temperatures and relative pressures of the medium 40 in the first channel side 211 and the second channel side 212, respectively, at the opposite sides of the second body 30 to thereby drive the sliding movements of the second body 30 within the first channel 21 toward or to the first or the second axial positions.

The excitable components 501 of the thermal element 50 can include features that are self-heating thermal elements and/or features that can be excitable by exposure to certain types of radiation or semiconductor heating processes. The types of radiation can include, but are not limited to, radio frequency (RF) radiation, infrared (IR) radiation, laser light, etc.

The thermal element 50 can be externally or remotely activated and the MEMS valve 10 can further include or be provided in a system, such as an exact microfluidics dispensation system 100 for use in, for example, a re-usable lab-on-a-chip, a high-volume biochemical screen with or without reagents, multi-purpose implantable/portable MEMS medical devices, such as glucose and blood thinner dispensaries, etc. As shown in FIG. 1, the exact microfluidics dispensation system 100 includes an actuator, which is composed of the thermal element 50 and an external or remote element 502, which is configured to emit the radiation towards the excitable components 501. The exact microfluidics dispensation system 100 further includes a flow sensor 503 and a controller 504. The flow sensor 503 is disposed within at least the outlet portion 222 and is configured to sense characteristics of fluid flows through the MEMS valve 10 of, more particularly, along the second channel 22 through the first body 20. The controller 504 is communicatively coupled to the flow sensor 503 and is configured to control operations of the remote element 502 in accordance with readings of the flow sensor 503.

In accordance with embodiments, the MEMS valve 10 can be actuated with a frequency of 1-1000 Hz or, more particularly, 1-10 Hz.

In accordance with further embodiments, it is to be understood that the size of the MEMS valve 10 is on the order of 1-10000 µm or 1-1000 µm or, more particularly, 1-100 µm. In any case, the size of the MEMS valve 10 will be large enough on a relative basis such that a heating of the medium 40 in the first channel 21 can be achieved without corresponding thermal expansion of either of the first or the second bodies 20 or 30. In addition, it is to be understood a heating of the medium 40 charged into the first channel side 211 is possible without also heating the medium charged into the second channel side 212 and vice versa For example, in the example of the FIG. 1, in an event the readings of the flow sensor 503 indicate that the MEMS valve 10 is open (i.e., that the second body 30 is disposed in one of the first positions) when the MEMS valve 10 should be closed, the controller 504 instructs the remote element 502 to excite the excitable components 501 in the first thermal element part 51. Conversely, in an event the readings of the flow sensor 503 indicate that the MEMS valve 10 is closed (i.e., that the second body 30 is disposed in one of the second positions) when the MEMS valve 10 should be open, the controller 504 instructs the remote element 502 to excite the excitable components 501 in the second thermal element part 52.

The above-described actuation of the MEMS valve 10 can be referred to as "thermo-pneumatic actuation" and can be based on Carnot cycle thermodynamics where input heat results in work on the system and movement of the second body 30 due to applied forces. The Carnot cycle has four distinct thermodynamic stages. They are reverse isothermic compression (P increases, V decreases, T increases; heat is applied), reverse adiabatic expansion (P decreases, V increases; work is applied), reverse isothermic expansion (P decreases, V increases, T decreases; work is applied) and reverse adiabatic compression (P increases, V decreases).

As shown in FIG. 1 the MEMS valve 10 can also include an additional channel 70 that is fluidly communicative with and breaks off from the second channel 22 or, more particularly, the inlet portion 221 of the second channel 22. The additional channel 70 can be provided for defining a flow passage for carrier fluid or gas and can be directly or indirectly connectable with the outlet portion 222. The additional channel 70 can also be provided to form a drain for fluid which is unused or otherwise remaining in the second channel 22. A control valve 71 can be operably disposed along the additional channel 70 to automatically or selectively control fluid flow through the additional channel 70.

Figure 2:
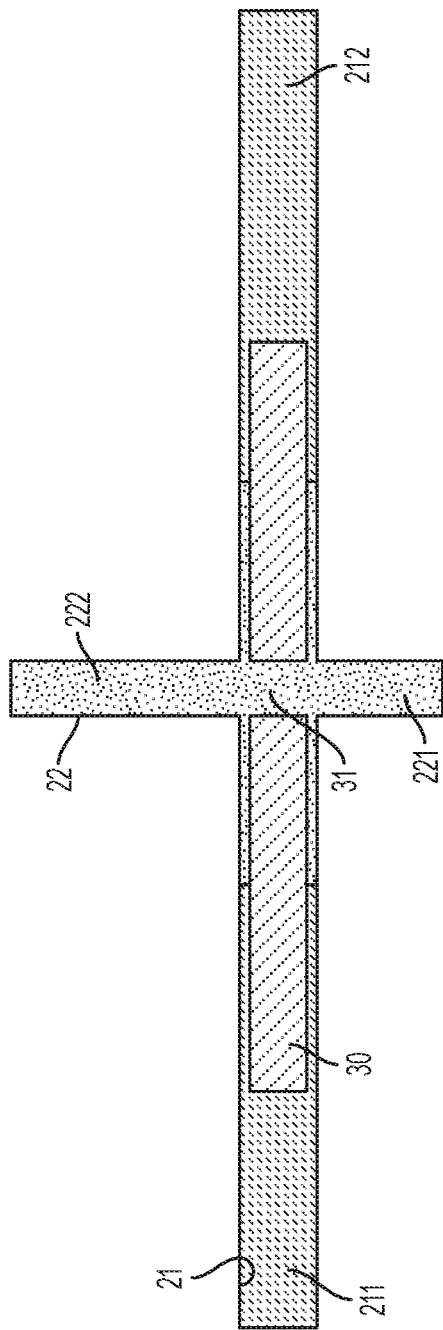
FIG. 2 is a schematic side view of a portion of the MEMS valve of FIG. 1 in accordance with embodiments.

With reference to FIG. 2, the second body 30 can be configured to be self-sealing within the first channel 21. The tight fit of the second body 30 within the first channel 21, which allows for movement of the second body 30 to and toward the first or second axial positions, provides for this self-sealing as fluid moving through the second channel 21. To the extent that this fluid leaks into the space between the second body 30 and the walls of the first channel 21, surface tension of the fluid and the length of the second body 30 from the third channel 31 to either longitudinal end of the second body 30 cooperatively prevent the fluid from leaking into the first channel side 211 or the second channel side 212.

Figure 3:
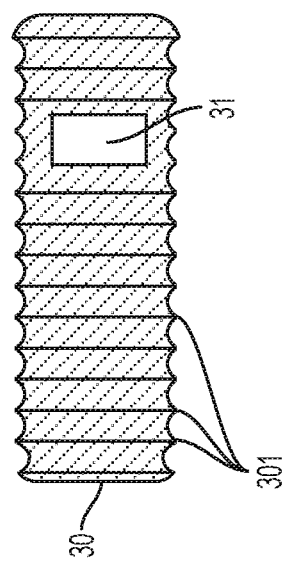
FIG. 3 is a side view of a second body of the MEMS valve of FIG. 1 in accordance with embodiments.

In accordance with embodiments and, as shown in FIG. 3, an exterior surface of the second body 30 can include scalloped sections 301. These scalloped sections 301 can be provided on one or more of the exterior surfaces of the second body 30 and serve to minimize surface contact with the walls of the first channel 21 while maintaining the tight fit of the second body 30 within the first channel 21.

With reference to FIG. 4, the second body 30 can be formed such that at least one of the first axial positions permits a unique level of flow through the second channel 22 and the third channel 31 and/or such that at least one of the second axial positions inhibits a unique level of flow through the second channel 31. As shown in FIG. 4, this flow moderation can be achieved by the second body 30 being formed to define multiple and variously gauged third channels $31_1$, fourth channels $31_2$, and fifth channels 313 where third channel $31_1$ provides for a relatively low level of flow, fourth channel $31_2$ provides for an intermediate level of flow and fifth channel 313 provides for a relatively high level of flow. Here, alignment of the third channel $31_1$ with the second channel 22 results from substantial heating of the medium 40 in the second channel side 212 which in turn drives or urges the second body 30 substantially toward the first channel side 211, alignment of the fifth channel 313 with the second channel 22 results from substantial heating of the medium 40 in the first channel side 211 which in turn drives or urges the second body 30 substantially toward the second channel side 212 and alignment of the fourth channel $31_2$ with the second channel 22 results from substantially similar heating of the medium 40 in the first and second channel sides 211 and 212 which in turn positions the second body 30 substantially between the first and second channel sides 211 and 212.

With reference to FIGS. 5 and 6, the MEMS valve 10 can also include stoppers 80. The stoppers 80 can be disposed within the first channel 21 as part of the first body 20 and are configured to interfere with the movements of the second body 30. As shown in FIG. 5, the stoppers 80 can be provided as flanges 81 extending into the first channel 21 to thereby prevent passage of the second body 30. As shown in FIG. 6, the second body 30 can include flared sections 32 at opposite longitudinal ends of the second body 30 and the stoppers 80 can be provided as a choked-off section 82 of the first channel 21

With reference back to FIG. 4, hydrophobic films 90 can be provided to line at least the first channel portion 210 of the first channel 21 and the second channel portion 220 of the second channel 22. Polymeric organosilicon compounds or silicones, such as polydimethylsiloxane (PDMS), can be used for the hydrophobic films 90.

Figure 7A:
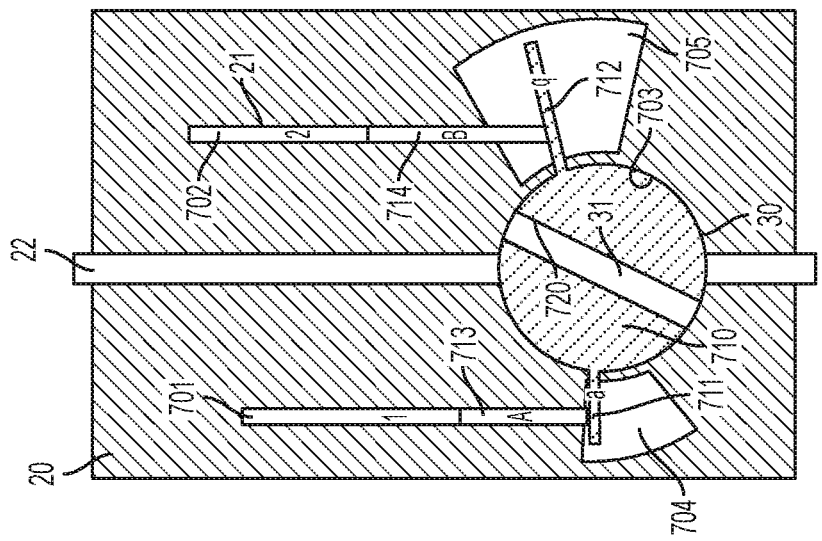
FIG. 7A is a schematic side view of an initial operational state of a MEMS valve in accordance with alternative embodiments.
Figure 7B:
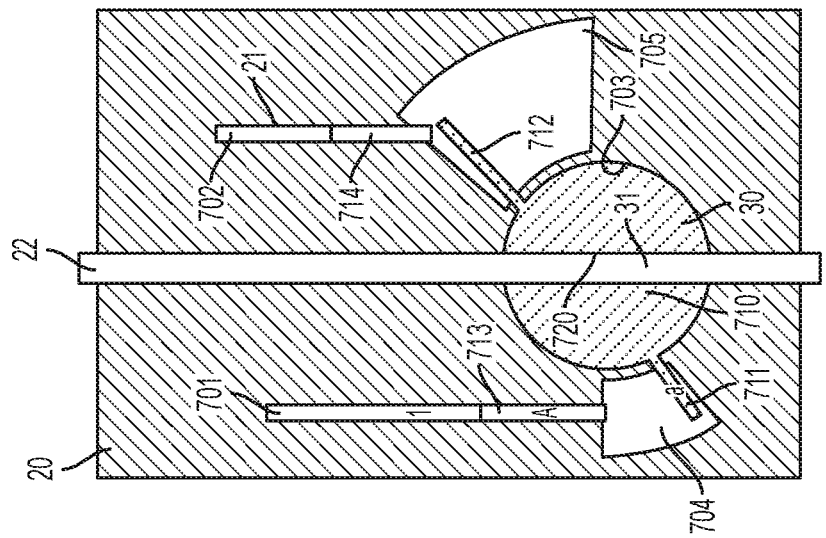
FIG. 7B is a schematic side view of an intermediate operational state of a MEMS valve in accordance with alternative embodiments.
Figure 7C:
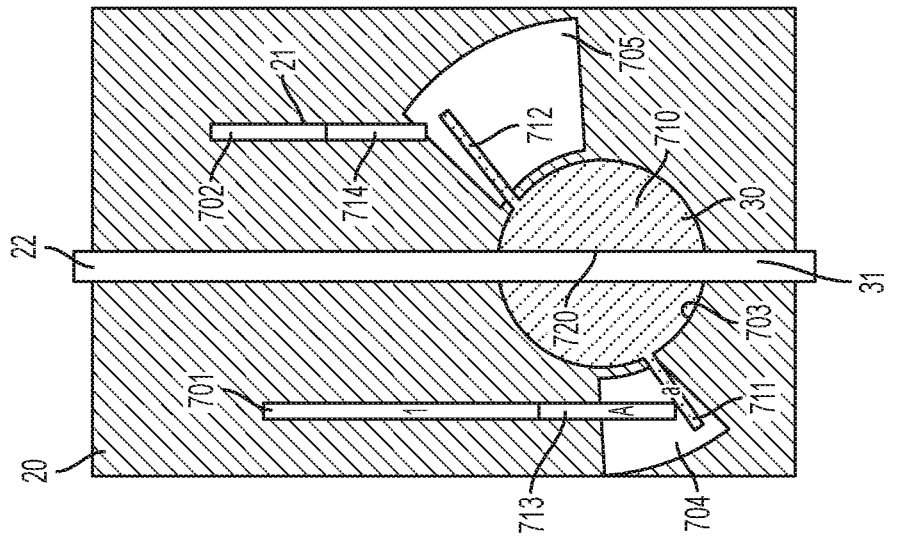
FIG. 7C is a schematic side view of a late operational state of a MEMS valve in accordance with alternative embodiments.
Figure 8:
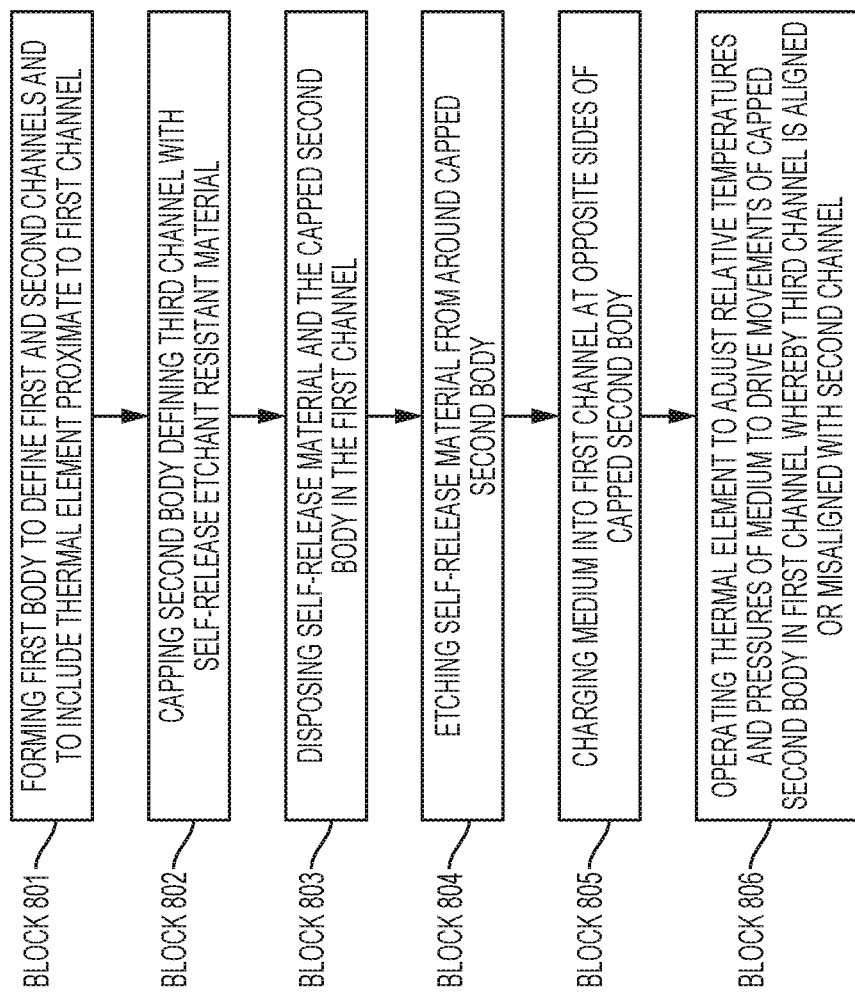
FIG. 8 is a flow diagram illustrating a method of fabricating and operating a MEMS valve in accordance with embodiments.

With reference to FIGS. 7A, 7B and 7C, the "rotary valve" embodiments will now be discussed though repeated descriptions of features already described above which are present in the "rotary valve" embodiments will be skipped.

As shown in FIGS. 7A, 7B and 7C, the first channel 21 includes a first channel portion 701, a second channel portion 702, a rotary channel portion 703 and first and second rotational angle defining portions 704 and 705. The rotary channel portion 703 is generally annular in shape and is substantially bisected by the second channel 22. The first and second rotational angle defining portions 704 and 705 extend outwardly from the rotary channel portion 703 in substantially opposite directions but need not be a same size and are provided as annular segments. The first channel portion 701 extends axially from the first rotational angle defining portion 704 and the second channel portion 702 extends axially from the second rotational angle defining portion 705. The first and second channel portions can be, but do not need to be, substantially parallel with each other.

The second body 30 includes a central disc 710, first and second radial members 711 and 712 extending outwardly from the central disc 710 in substantially opposite directions and first and second elongate members 713 and 714 which are disposable in the first and second channel portions 701 and 702. The central disc is rotatably disposable in the rotary channel portion 703 and the first and second radial members 711 and 712 extend into the first and second rotational angle defining portions 704 and 705, respectively. The first and second elongate members 713 and 714 can slide within the first and second channel portions 701 and 702 and in doing so impinge upon the first and second radial members 711 and 712 to cause rotations of the central disc 710. The central disc 710 is formed to define at least one third channel 720 which is disposed, configured and oriented to be rotated into and out of alignment with the second channel 22. The first and second elongate members 713 and 714 and the central disc are sized to tightly fit (i.e., with limited clearance) in the first and second channel portions 701 and 702 and in the rotary channel portion 703, respectively, while remaining rotatable between first rotational positions and second rotational positions.

The first rotational positions are those rotational positions at which the central disc 710 is rotationally positioned within the rotary channel portion 703 whereby the second channel 22 and the at least one third channel 720 are rotationally aligned with each other and thus permit flow through the second channel 22 and the at least one third channel 720. Conversely, the second rotational positions are those rotational positions at which the central disc 710 is rotationally positioned within the rotary channel portion 703 whereby the second channel 22 and the at least one third channel 720 are rotationally misaligned with each other and thus inhibit flow through the second channel 22. That is, when the central disc 710 is rotationally positioned at one or more of the first rotational positions, the at least one third channel 720 becomes rotationally aligned with the second channel 22 and fluid flow is thus permitted through the inlet portion 221, then through the at least one third channel 31 and then through the outlet portion 222. On the other hand, when the central disc 710 is rotationally positioned at one or more of the second rotational positions, the at least one third channel 720 becomes rotationally misaligned with the second channel 22 and fluid flow is thus blocked by the second body 30 such that the fluid flow is inhibited from flowing through the inlet portion 221 and to either the third channel 31 or the outlet portion 222.

With the arrangement described herein, the second body effectively divides the first channel 21 into a first channel side 211 beyond the first elongate member 713 and a second channel side 212 beyond the second elongate member 714. The medium 40 is charged into the first channel side 211 and into the second channel side 212. As such, as shown in FIG. 7A, with the medium 40 charged into the first channel side 211 heated and increased in volume, the first elongate member 713 is driven or urged toward the first radial member 711 and causes the central disc 710 to rotate counter-clockwise (i.e., into a first rotational position). Subsequently, as shown in FIGS. 7B and 7C, with the medium 40 charged into the first channel side 211 cooled and decreased in volume (see FIG. 7B) and with the medium 40 charged into the second channel side 212 heated and increased in volume (see FIG. 7C), the second elongate member 714 is driven or urged toward the second radial member 712 and causes the central disc 710 to rotate clockwise (i.e., into a second rotational position).

Here, it is to be understood that the above-described features of the thermal element 50, the exact microfluidics dispensation system 100, the additional channel 70 and the control valve 71, the stoppers 80, the self-sealing capability and the scalloped sections 301, the moderated levels of flows and the hydrophobic films 90 are applicable to the "rotary valve" embodiments similarly as they are respectively presented above. For example, the stoppers 80 can be provided as the angular or circumferential lengths of the first and second rotational angle defining portions 704 and 705 which limit a range of motion of the first and second elongate members 713 and 714. Similarly, the scalloped sections 301 can be present along a circumferential edge of the central disc 710 and the hydrophobic films 90 can be provided along circumferential edges of the rotary channel portion 703.

With reference to FIG. 8, a method of fabricating and operating the MEMS valve 10 is provided. As shown in FIG. 8, the method initially includes forming the first body 20 to define the first channel 21 and the second channel 22 intersecting the first channel 21 and to include the thermal element 50 proximate to the first channel 21 (block 801). The method also includes capping the second body 30, which defines the third channel 31, with self-release etchant resistant material, such as nitride or plasma enhanced chemical vapor deposited (PECVD) nitride (block 802). At this point, the method includes disposing self-release material, such as oxide, and the capped second body 30 in the first channel 21 such that the self-release material surrounds the capped second body 30 and such that the third channel 31 is parallel with and movably (e.g., slidably or rotatably) disposed for alignment or misalignment relative to the second channel 22 (block 803) and etching the self-release material from around the capped second body 30 (block 804).

In accordance with embodiments, the method can also include charging the medium 40 into the first channel 21 at the opposite sides of the capped second body 30 (block 805) and operating the thermal element 50 to adjust relative temperatures and pressures of the medium 40 to thereby drive movements of the capped second body 30 in the first channel 21 whereby the third channel 31 is aligned or misaligned with the second channel 22 (block 806).

With reference to FIGS. 9-16, methods of fabricating the MEMS valve 10 and, more particularly, of disposing the self-release material and the capped second body 30 in the first channel 21 as described above will now be described in further detail and in accordance with embodiments.

Figure 9:
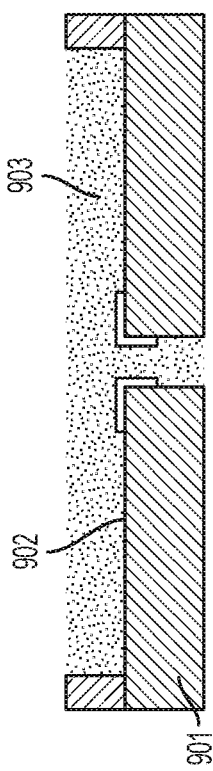
FIG. 9 is a schematic illustration of a first initial stage of a fabrication of a MEMS valve in accordance with embodiments.
Figure 11:
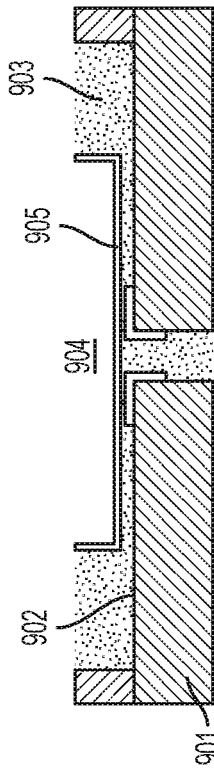
FIG. 11 is a schematic illustration of a first intermediate stage of a fabrication of a MEMS valve in accordance with embodiments.
Figure 10:
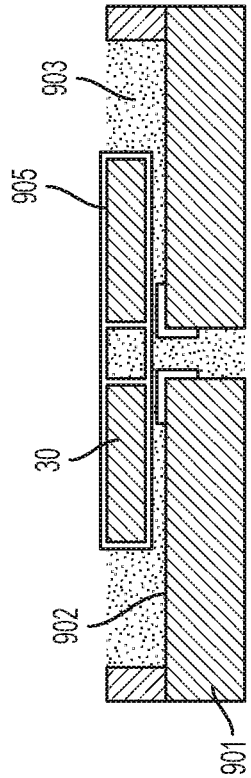
FIG. 10 is a schematic illustration of a second initial stage of a fabrication of a MEMS valve in accordance with embodiments.

As shown in FIG. 9, a lower portion 901 of the first body 20 (where the thermal element 50 can be provided) is formed, patterned and etched from photoresist material, which can be selected based on characteristic rigidity, thermal conductivity and a high melting point, to define the inlet portion 221 of the second channel 22 and to define a lower portion 902 of the first channel 21. Hydrophobic films 90 can be deposited, patterned and etched at the intersecting first channel portion 210 and second channel portion 220. Next, as shown in FIG. 10, the self-release material 903 (or oxide) is deposited into the inlet portion 221 of the second channel 22 and the lower portion 902 of the first channel 21 and, as shown in FIG. 11, a recess 904 is patterned into the self-release material 903.

Figure 13:
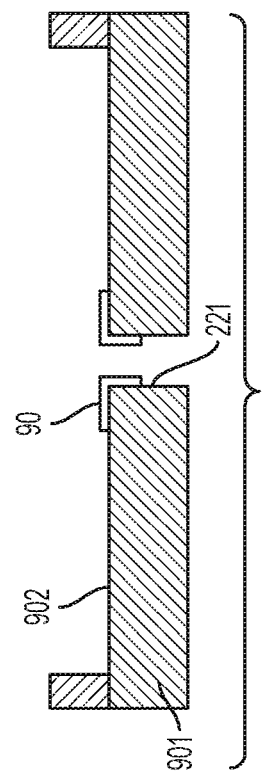
FIG. 13 is a schematic illustration of a third intermediate stage of a fabrication of a MEMS valve in accordance with embodiments.
Figure 12:
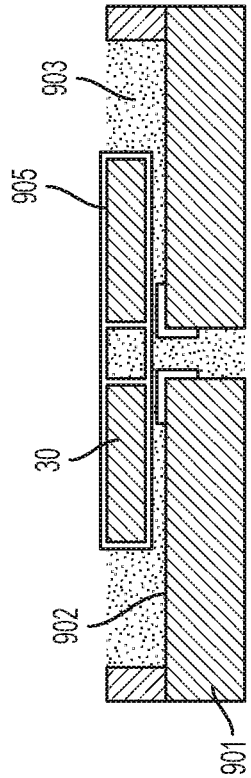
FIG. 12 is a schematic illustration of a second intermediate stage of a fabrication of a MEMS valve in accordance with embodiments.
Figure 14:
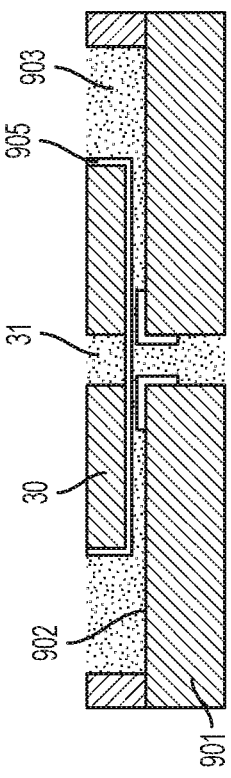
FIG. 14 is a schematic illustration of a fourth intermediate stage of a fabrication of a MEMS valve in accordance with embodiments.

Once the recess 904 is patterned into the self-release material 903, self-release etchant resistant material 905 is deposited on the self-release material 903 in the recess 904 and on the uppermost surfaces of the self-release material 903 outside of the recess 904 and the lower portion 901 of the first body 20. The deposited self-release etchant resistant material 905 is then etched or polished such that only the self-release etchant resistant material 905 in the recess 904 remains as shown in FIG. 12. At this point, the second body 30 is formed on the self-release etchant resistant material 905 in the recess 904 as shown in FIG. 13 and an additional amount of the self-release etchant resistant material 905 is deposited on exposed surfaces of the second body 30 as shown in FIG. 14.

In accordance with embodiments, the forming of the second body 30 will employ tolerance levels which are defined based on expected chamber pressures and inlet fluid pressures. More complex side wall designs (i.e., those that include the scalloped sections 301) can be fabricated to minimize surface area while maximizing tolerances. For example, the material of the second body 30 can be selected to exhibit little to no deformation against static fluid pressures (e.g., PECVD nitride σ=2.4 GPa, u=0.253) and/or such that the second body 30 has a relatively low mass to minimize inertial forces required for actuation (e.g., Xerogel™ □=0.24 g/cm3).

As shown in FIG. 15, an upper portion 906 of the first body 20 is formed to define the outlet portion 222 of the second channel 22 and to define an upper portion 907 of the first channels 21, hydrophobic films 91 can be deposited at the intersecting first channel portion 210 and second channel portion 220 and an additional amount of the self-release material 903 can be deposited to fill in the first channel 21. At this point, as shown in FIG. 16, the self-release material 903 is etched to free the second body 30.

For the sake of brevity, conventional techniques related to semiconductor device and integrated circuit (IC) fabrication can or cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A micro electrical mechanical system (MEMS) valve, comprising:
   a first body defining a first channel and a second channel intersecting the first channel;
   a second body comprising a first portion and a second portion, the first portion comprising a third channel having a first gauge, the second portion comprising a fourth channel having a second gauge larger than the first gauge, and the second body movably disposed within the first channel to move between:
      first positions with the second and third channels aligned to permit flow through the second and third channels at a first flow rate;
      second positions with the second and fourth channels aligned to permit flow through the second and fourth channels at a second flow rate greater than the first flow rate; and
      third positions with the second channel misaligned to the third and fourth channels to inhibit flow through the second channel;
   a medium charged into the first channel at opposite sides of the second body; and
   a thermal element proximate to the first channel and operable to adjust relative temperatures and pressures of the medium at the opposite sides of the second body to drive movements of the second body, the thermal element activated by an element positioned outside of the first body.

2. The MEMS valve according to claim 1, wherein the first body further defines an additional channel fluidly communicative with the second channel.

3. The MEMS valve according to claim 1, wherein the second body is configured to inhibit flow in a space between the second body and sidewalls of the first channel.

4. The MEMS valve according to claim 1, wherein an exterior surface of the second body is scalloped.

5. The MEMS valve according to claim 1, further comprising stoppers disposed within the first channel to interfere with the movements of the second body.

6. The MEMS valve according to claim 1, further comprising hydrophobic film lining at least intersecting portions of the first and second channels.

7. The MEMS valve according to claim 1, wherein the movements of the second body are sliding movements.

8. The MEMS valve according to claim 1, wherein the movements of the second body are rotary movements.

9. An exact microfluidics dispensation system, comprising:
   a micro electrical mechanical system (MEMS) valve comprising:
      a first body defining a first channel and a second channel intersecting the first channel;
      a second body movably disposed within the first channel of the first body to permit or prevent fluid flow through the first body, the second body comprising a first portion and a second portion, the first portion comprising a third channel having a first gauge, the second portion comprising a fourth channel having a second gauge larger than the first gauge; and
      an actuator configured to operate the MEMS valve without deforming the MEMS valve, the actuator comprising an excitation element which is controllable by a controller to operate a thermal element, the excitation element positioned outside of the first body;
   a sensor disposed to sense fluid flow through the first body and to generate readings accordingly; and the controller coupled to the actuator and the sensor and configured to control the actuator based on the readings of the sensed fluid flow generated by the sensor.

10. The exact microfluidics dispensation system according to claim 9, wherein:
   the second body is movably disposed within the first channel to move between:
   first positions whereby the second and third channels are aligned and thus permit flow through the second and third channels, and
   second positions whereby the second and third channels are misaligned and thus inhibit flow through the second channel.

11. The exact microfluidics dispensation system according to claim 10, wherein the actuator further comprises:
   a medium charged into the first channel at opposite sides of the second body;
   wherein the thermal element is proximate to the first channel and operable to adjust relative temperatures and pressures of the medium at the opposite sides of the second body to thereby drive movements of the second body to the first or the second positions.

12. The exact microfluidics dispensation system according to claim 9, wherein the second body is disposed to slide within the first body.

13. The exact microfluidics dispensation system according to claim 9, wherein the second body is disposed to rotate within the first body.

* * * * *